United States Patent
Ito et al.

(10) Patent No.: US 8,749,314 B2
(45) Date of Patent: Jun. 10, 2014

(54) OVEN-CONTROLLED CRYSTAL OSCILLATOR

(75) Inventors: Manabu Ito, Saitama (JP); Hiroyuki Mitome, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 2 days.

(21) Appl. No.: 13/488,223

(22) Filed: Jun. 4, 2012

(65) Prior Publication Data
US 2012/0306582 A1 Dec. 6, 2012

(30) Foreign Application Priority Data
Jun. 6, 2011 (JP) ................................. 2011-126297

(51) Int. Cl.
*H03B 1/00* (2006.01)

(52) U.S. Cl.
USPC ................ 331/69; 331/70; 331/158; 331/176

(58) Field of Classification Search
USPC .............. 331/69, 70, 158, 160, 176, 185, 186
See application file for complete search history.

(56) References Cited

U.S. PATENT DOCUMENTS

| | | | | |
|---|---|---|---|---|
| 7,714,694 B2* | 5/2010 | Landsberger et al. | ............ | 338/9 |
| 2001/0040154 A1* | 11/2001 | Hashimoto et al. | ........... | 219/210 |
| 2010/0289589 A1* | 11/2010 | Ito et al. | ......................... | 331/70 |

FOREIGN PATENT DOCUMENTS

| JP | 2005-165630 A | 6/2005 |
|---|---|---|
| JP | 2011-004382 A | 1/2011 |

* cited by examiner

*Primary Examiner* — Joseph Chang
*Assistant Examiner* — Jeffrey Shin
(74) *Attorney, Agent, or Firm* — Knobbe Martens Olson & Bear LLP

(57) ABSTRACT

A crystal unit and a thermistor with negative resistance-temperature characteristics are housed in a thermostatic oven heated by a heater. A transistor driving the heater is controlled by an output of a differential amplifier, the thermistor is placed between a power supply voltage and an inverting input of the amplifier, and a first resistor used to adjust the temperature of a zero temperature coefficient point of the crystal unit is installed between the inverting input and a ground point. A second resistor is installed between the power supply voltage and a non-inverting input of the amplifier and a third resistor is installed between the non-inverting input and ground point. One of the second and third resistors is a resistor assembly made up of a plurality of resistance elements and one of these resistance elements is provided with positive resistance-temperature characteristics and adapted to detect ambient temperature.

2 Claims, 3 Drawing Sheets

OVEN-CONTROLLED CRYSTAL OSCILLATOR

BACKGROUND OF THE INVENTION

1. Field of the Invention

The present invention relates to an oven-controlled crystal oscillator (OCXO), the oven-controlled crystal oscillator being equipped with: a crystal unit or crystal element; a thermostatic oven which contains the crystal unit and keeps temperature of the crystal unit constant, and an oscillator circuit which uses the crystal unit.

2. Description of the Related Art

A crystal oscillator which incorporates, as an integral component, a quartz crystal unit and an oscillator circuit using the crystal unit outputs an oscillating signal of an accurate predetermined frequency simply when mounted on a circuit board or the like and supplied externally with a power supply voltage. The crystal oscillator is thus used widely as a frequency or time reference source in various electronic devices.

A vibration frequency of the crystal unit has high stability, but changes slightly with temperature due to frequency-temperature characteristics inherent to quartz. To deal with this, an oven-controlled crystal oscillator is available as a crystal oscillator which outputs a particularly accurate oscillation frequency, where the oven-controlled crystal oscillator includes a crystal unit or crystal element contained in a thermostatic oven or a constant temperature bath adapted to keep temperature of the crystal unit constant. Generally, the thermostatic oven is configured to be heated by an electric heater. Temperature in the thermostatic oven is detected by a temperature sensor installed in the thermostatic oven and detection results are fed back to a drive circuit of the heater to keep the temperature in the thermostatic oven constant. If the temperature of the thermostatic oven is set such as to minimize frequency changes due to temperature changes based on the frequency-temperature characteristics of the crystal unit, even if the temperature of the thermostatic oven varies minutely under the influence of ambient temperature, the oscillation frequency of the oven-controlled crystal oscillator is kept most stable. The vibration frequency of the crystal unit changes, for example, as a quadratic function or cubic function of temperature although this depends on the orientation in which a crystal blank (i.e., a vibrating piece) of the crystal unit is cut from a crystal of quartz. Consequently, the vibration frequency does not change with minute temperature changes around the temperature at a vertex of the function curve. This results in a zero temperature coefficient. Thus, this temperature is referred to as a zero temperature coefficient (ZTC) point. With the oven-controlled crystal oscillator, the temperature of the thermostatic oven is generally set at the ZTC point of the crystal unit.

FIG. 1 is a circuit diagram showing a configuration of an oven-controlled crystal oscillator according to a related art.

Thermostatic oven 10 houses crystal unit X and thermistor Th adapted to detect the temperature in thermostatic oven 10. Thermostatic oven 10 is designed to be heated by electric heater H, which is connected at one end to power supply terminal 11 and connected at the other end to a collector of power transistor 15 for driving. An emitter of transistor 15 is grounded. With the illustrated crystal oscillator, heater H is installed in thermostatic oven 10. Crystal unit X is electrically connected to oscillator circuit 13 which uses crystal unit X, and an oscillating signal is outputted from oscillator circuit 13 to output terminal 14. Here, oscillator circuit 13 is installed outside thermostatic oven 10, but may be installed in thermostatic oven 10. Power supply voltage Vcc1 is supplied externally to power supply terminal 11, but stabilized power supply circuit 12 is installed to generate more stable power supply voltage Vcc2 from power supply voltage Vcc1. Oscillator circuit 13 is supplied with power supply voltage Vcc2.

As thermistor Th, one with non-linear negative resistance-temperature characteristics is used. The negative resistance-temperature characteristics are resistance-temperature characteristics which have a negative resistance temperature coefficient. To drive heater H by feeding back detection results produced by thermistor Th, resistors R1 to R3 and differential amplifier 16 are installed and an output from the differential amplifier is connected to a base of power transistor 15. Thermistor Th is connected at one end to power supply voltage Vcc2, and at the other end to an inverting input terminal (−) of differential amplifier 16. Resistor R1 is installed between the inverting input terminal (−) and a ground point. Resistor R2 is installed between a non-inverting input terminal (+) of differential amplifier 16 and power supply voltage Vcc2 while resistor R3 is installed between the non-inverting input terminal (+) and ground point. Thus, thermistor Th, resistors R1 to R3, differential amplifier 16, and power transistor 15 make up a temperature control circuit of thermostatic oven 10. Except for thermistor Th, the elements making up the temperature control circuit are installed outside thermostatic oven 10 and affected by ambient temperature.

With this configuration, if resistors R1 to R3 are set such that a ratio between resistance value of thermistor Th at the ZTC point of crystal unit X and resistor R1 will coincide with a ratio between resistor R2 and resistor R3, differential amplifier 16 controls transistor 15 so as to reduce collector current of transistor 15 when the temperature in thermostatic oven 10 rises and consequently the resistance value of thermistor Th decreases, and conversely to increase collector current when the temperature in thermostatic oven 10 falls and consequently the resistance value of thermistor Th increases. Since the collector current of transistor 15 flows through heater H, heater current is controlled, after all, such that the temperature in thermostatic oven 10 will be kept at the ZTC point.

Actually, with the circuit shown in FIG. 1, whereas the heater current is zero when the temperature in thermostatic oven 10 is exactly at the ZTC point, the temperature in thermostatic oven 10 does not precisely reach the ZTC point and has some deviation from the ZTC point because there is some heat dissipation from thermostatic oven 10. To compensate for this deviation, it is conceivable to set resistors R1 to R3 such that a temperature slightly higher than the ZTC point will be a control target, but since an amount of heat dissipating from thermostatic oven 10 depends on the ambient temperature, the temperature of thermostatic oven 10 ends up being affected by the ambient temperature. Thus, to keep the temperature in the thermostatic oven at the ZTC point, JP2005-165630A proposes an oven-controlled crystal oscillator with a configuration in which a resistor corresponding to resistor R2 in the circuit shown in FIG. 1 is provided with linear positive resistance-temperature characteristics and arranged to change in resistance according to the ambient temperature such that the current flowing through heater H will increase with decreases in the ambient temperature.

JP2011-4382A discloses a technique for maintaining a predetermined temperature in the thermostatic oven by using a thermistor adapted to detect the ambient temperature as well as a thermistor adapted to detect the temperature in the thermostatic oven and performing open-loop control based on the ambient temperature as well as closed-loop control based on the temperature in the thermostatic oven.

The ZTC point of the crystal unit varies slightly from product to product even if crystal blanks cut in the same orientation are used and the vibration frequency is identical. Therefore, in order to produce an oven-controlled crystal oscillator with higher frequency accuracy, it is necessary observe the oscillation frequency and detect the ZTC point, with the crystal unit contained in the thermostatic oven while changing the temperature of the thermostatic oven by driving a heater adapted to heat the thermostatic oven, determine the target values of the resistors in the temperature control circuit according to the detected ZTC point, and adjust the resistors to the target values. For example, with the circuit configuration shown in FIG. 1, at least one of resistors R1 to R3 is adjusted. Actually, resistor R1 is adjusted in many cases. However, even if such adjustments are made, depending on the structure of the thermostatic oven and arrangement of the thermistor in the thermostatic oven, the thermistor temperature will not accurately match the temperature of the crystal unit. Also, since the amount of heat radiated to the surroundings from the thermostatic oven depends on the ambient temperature, the ZTC point determined based on the temperature detected by the thermistor, i.e., an apparent ZTC point itself, will vary with the ambient temperature. Since control is performed based on the temperature detected by the thermistor in the thermostatic oven, if the apparent ZTC point varies, the control cannot be performed properly. Even if the resistance values in the temperature control circuit are adjusted according to the ZTC point of the crystal unit, since the resistors themselves have resistance temperature coefficients and change their resistance values with the ambient temperature, it is also necessary to think about compensating for these changes.

After all, to construct a high-accuracy oven-controlled crystal oscillator, it is not enough to merely install a temperature sensor adapted to detect the ambient temperature in addition to a thermistor adapted to detect the temperature in the thermostatic oven, and it is necessary to give sufficient consideration to the configuration and adjustment method of the temperature control circuit.

When temperature control is performed using a thermistor, relationship between the ambient temperature and actual temperature in the thermostatic oven is, for example, roughly such that the temperature in the thermostatic oven rises with rises in the ambient temperature as indicated by a thick line in FIG. 2A because reduction in the amount of heat produced by the heater is insufficient compared with rises in the ambient temperature, or such that the temperature in the thermostatic oven falls with rises in the ambient temperature as indicated by a thick line in FIG. 2B because reduction in the amount of heat produced by the heater is excessive compared with rises in the ambient temperature. Which of the temperature characteristics shown in FIGS. 2A and 2B actually come into play depends on various factors including the structure and thermal environment of the thermostatic oven itself and its surroundings and the arrangement of the thermistor in the thermostatic oven. In either case, the temperature control circuit needs to be configured and adjusted so as to make compensation such that the temperature in the thermostatic oven will remain constant and coincide with a true ZTC point regardless of the ambient temperature as illustrated by broken lines in the FIGS. 2A and 2B.

SUMMARY OF THE INVENTION

An object of the present invention is to provide an oven-controlled crystal oscillator which is able to deal with differences in ZTC point among crystal units and is free from frequency variations even if ambient temperature varies.

According to an exemplary aspect of the present invention, an oven-controlled crystal oscillator includes: a thermostatic oven; a crystal unit housed in the thermostatic oven; an oscillator circuit which uses the crystal unit; a heater that heats the thermostatic oven; and a temperature control circuit that drives the heater so as to make temperature in the thermostatic oven equal to temperature of a zero temperature coefficient point of the crystal unit, wherein the temperature control circuit includes: a power transistor installed in series with the heater; a differential amplifier that drives the power transistor; a thermistor that installed in the thermostatic oven, provided with negative resistance-temperature characteristics, and connected between a power supply voltage and an inverting input terminal of the differential amplifier; a first resistor installed between the inverting input terminal and a ground point and used to adjust the temperature of the zero temperature coefficient point; a second resistor installed between the power supply voltage and a non-inverting input terminal of the differential amplifier; and a third resistor installed between the ground point and the non-inverting input terminal, and wherein one of the second resistor and the third resistor is configured as a resistor assembly made up of a plurality of resistance elements, one of the resistance elements in the resistor assembly being a temperature-detecting resistance element provided with positive resistance-temperature characteristics and adapted to detect ambient temperature.

With the above configuration, a thermistor which generally have highly non-linear, negative resistance-temperature characteristics detects the temperature in the thermostatic oven and feeds back the detected temperature to the inverting input terminal (i.e., (−) input) of the differential amplifier. A so-called resistor network made up of first and second resistors and connected to the non-inverting input terminal (i.e., (+) input) of the differential amplifier incorporates a resistance element provided with positive resistance-temperature characteristics and adapted to detect the ambient temperature in addition to at least two regular resistance elements. This configuration makes it possible to deal with differences in the ZTC point among crystal units, compensate for apparent changes in the ZTC point due to the ambient temperature, and further stabilize the oscillation frequency of the oven-controlled crystal oscillator.

DESCRIPTION OF THE EMBODIMENTS

Next, oven-controlled crystal oscillators according to preferred embodiments of the present invention will be described.

Figure 1:
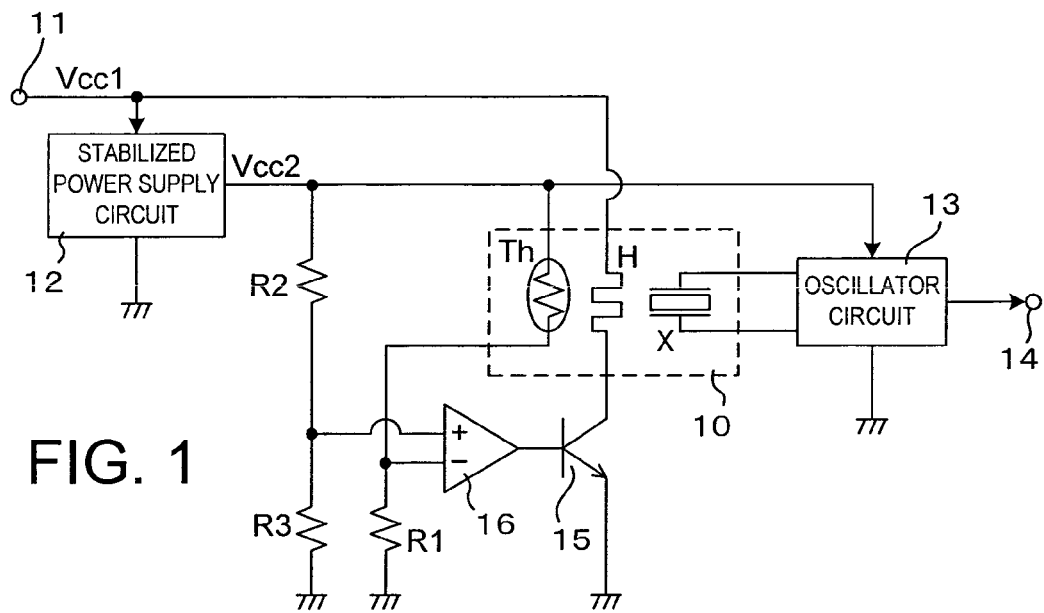
FIG. 1 is a circuit diagram showing a configuration of an oven-controlled crystal oscillator according to a related art.
Figure 2A:
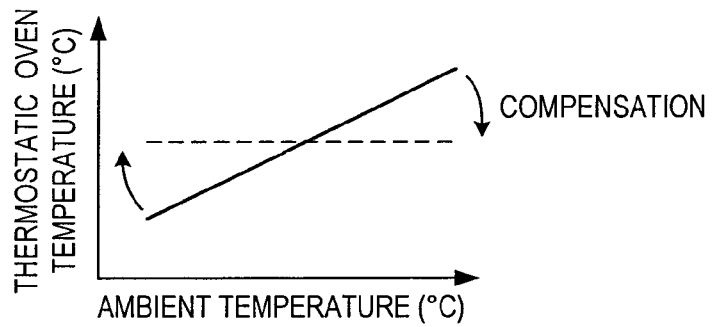
FIGS. 2A and 2B are graphs showing relationships between ambient temperature and temperature in a thermostatic oven.
Figure 3:
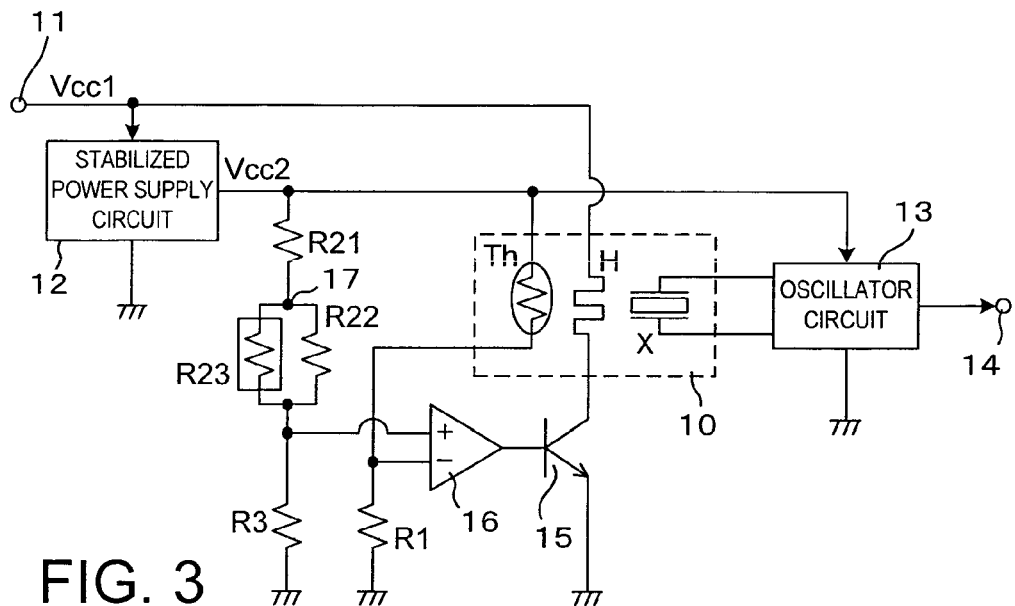
FIG. 3 is a circuit diagram showing a configuration of an oven-controlled crystal oscillator according to an embodiment of the present invention.

An oven-controlled crystal oscillator according to an embodiment of the present invention shown in FIG. 3 is similar to the one shown in FIG. 1, but differs from the one shown in FIG. 1 in circuit configuration of the temperature control circuit. Specifically, the circuit shown in FIG. 3 has resistors R21 to R23 installed instead of resistor R2 of the circuit shown in FIG. 1. Resistor R21 is supplied at one end with power supply voltage Vcc2 and connected at the other end to connection node 17. Resistors R22 and R23 are installed in parallel between connection node 17 and the non-inverting input terminal (+) of differential amplifier 16. The circuit shown in FIG. 3 is intended to keep temperature in a thermostatic oven or a constant temperature bath constant and equal to a ZTC point of crystal unit X regardless of ambient temperature when there is a relationship such as shown in FIG. 2A between the ambient temperature and the actual temperature in the thermostatic oven, i.e., when there is a relationship whereby the temperature in the thermostatic oven rises with increases in the ambient temperature.

In the configuration shown in FIG. 3, whereas resistors R1, R3, R21, and R22 are regular resistance elements with low resistance temperature coefficients, resistor R23 serving as a temperature sensor adapted to detect the ambient temperature is a resistance element with linear positive resistance-temperature characteristics. Resistor R1 is a ZTC adjustment resistor adapted to compensate for dispersion in the ZTC point of crystal unit X. Resistor R1 has its value set based on an actually measured ZTC point of crystal unit X. On the other hand, resistors R21, R22, and R3 are used for sensitivity adjustment of the temperature control circuit. As described above, the apparent ZTC point based on the temperature values detected by thermistor Th can vary with the ambient temperature, but thanks to these three sensitivity adjustment resistors R21, R22, and R3 as well as resistor R23 adapted to detect the ambient temperature and provided with positive resistance-temperature characteristics, even if the ambient temperature changes, the temperature of crystal unit X can always be set at the ZTC point. For example, by finding the apparent ZTC point of crystal unit X at each of two ambient temperature points within a conceivable temperature range of the ambient temperature of the crystal oscillator, it is possible to determine resistance values of resistors R21, R22, and R3 which will not cause changes in the apparent ZTC point. In this case, the apparent ZTC point at each ambient temperature can be determined by finding the vibration frequency of crystal unit X with varying the temperature in thermostatic oven 10 detected by thermistor Th.

Figure 4:
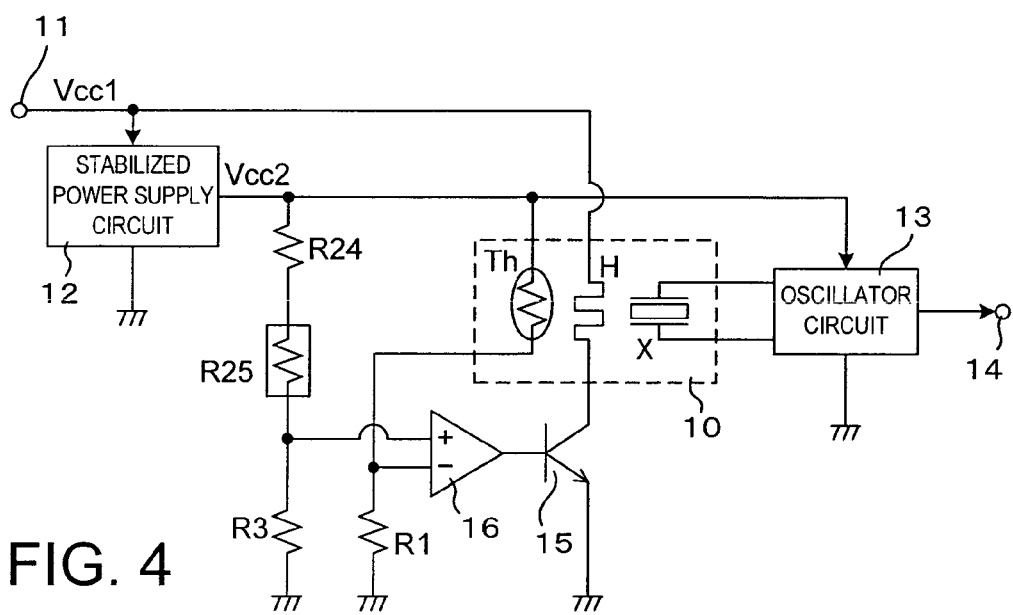
FIG. 4 is a circuit diagram showing a configuration of an oven-controlled crystal oscillator according to another embodiment of the present invention.

An oven-controlled crystal oscillator according to another embodiment of the present invention shown in FIG. 4 is similar to the one shown in FIG. 1, but differs from the one shown in FIG. 1 in that resistor R24 and resistor R25 connected in series are installed instead of resistor R2, where resistor R24 is a regular resistance element with a low resistance temperature coefficient while resistor R25 has linear positive resistance-temperature characteristics. Both resistors R1 and R3 are regular resistance elements with low resistance temperature coefficients. The circuit shown in FIG. 4 is also intended to keep temperature in the thermostatic oven constant and equal to the ZTC point of crystal unit X regardless of ambient temperature when there is a relationship such as shown in FIG. 2A between the ambient temperature and the actual temperature in the thermostatic oven. In the circuit of FIG. 4, resistor R1 is used for ZTC adjustment, resistors R3 and R24 are used for sensitivity adjustment, and resistor R25 is used for detection of the ambient temperature. If the two sensitivity adjustment resistors R3 and R24 are set in the same manner as described above, even if the ambient temperature changes, the temperature of crystal unit X can always be set at the ZTC point.

Figure 2B:
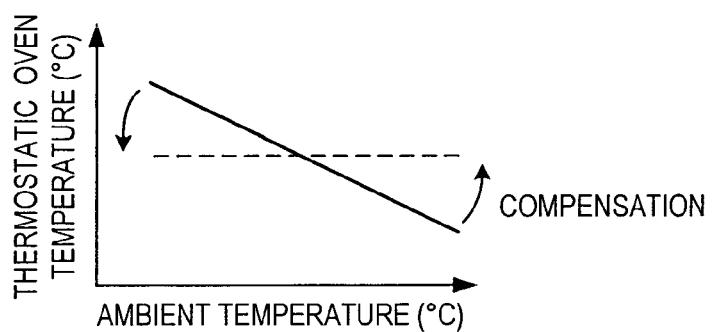
Figure 5:
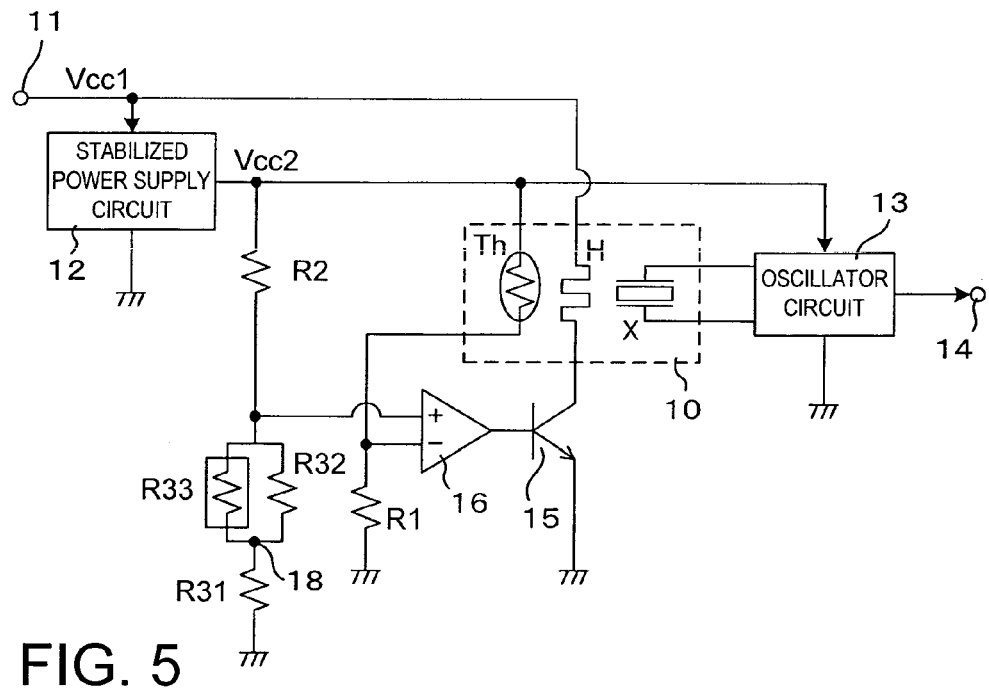
FIG. 5 is a circuit diagram showing a configuration of an oven-controlled crystal oscillator according to still another embodiment.

An oven-controlled crystal oscillator according to still another embodiment of the present invention shown in FIG. 5 is similar to the one shown in FIG. 1, but differs from the one shown in FIG. 1 in circuit configuration of the temperature control circuit. Specifically, the circuit shown in FIG. 5 has resistors R31 to R33 installed instead of resistor R3 of the circuit shown in FIG. 1. Resistor R31 is grounded at one end and connected at the other end to connection node 18. Resistors R32 and R33 are installed in parallel between connection node 18 and the non-inverting input terminal (+) of differential amplifier 16. Unlike the circuit shown in FIG. 3, the circuit shown in FIG. 5 is intended to keep temperature in the thermostatic oven constant and equal to the ZTC point of crystal unit X regardless of ambient temperature when there is a relationship such as shown in FIG. 2B between the ambient temperature and the actual temperature in the thermostatic oven, i.e., when there is a relationship whereby the temperature in the thermostatic oven falls with increases in the ambient temperature.

In the configuration shown in FIG. 5, whereas resistors R1, R2, R31, and R32 are regular resistance elements with low resistance temperature coefficients, resistor 33 serving as a temperature sensor adapted to detect the ambient temperature is a resistance element with linear positive resistance-temperature characteristics. Resistor R1 is used for ZTC adjustment while resistors R2, R31, and R32 are used for sensitivity adjustment of the temperature control circuit. As described above, the apparent ZTC point based on the temperature values detected by thermistor Th can vary with the ambient temperature, but thanks to these three sensitivity adjustment resistors R31, R32, and R2 as well as resistor R33 adapted to detect the ambient temperature and provided with positive resistance-temperature characteristics, even if the ambient temperature changes, the temperature of crystal unit X can always be set at the ZTC point. For example, by finding the vibration frequency of crystal unit X and thereby finding the apparent ZTC point for each of two ambient temperature points within a conceivable temperature range of the ambient temperature of the crystal oscillator while the temperature in thermostatic oven 10 detected by thermistor Th is varied, it is possible to determine resistance values of resistors R2, R31, and R32 which will not cause changes in the apparent ZTC point.

Figure 6:
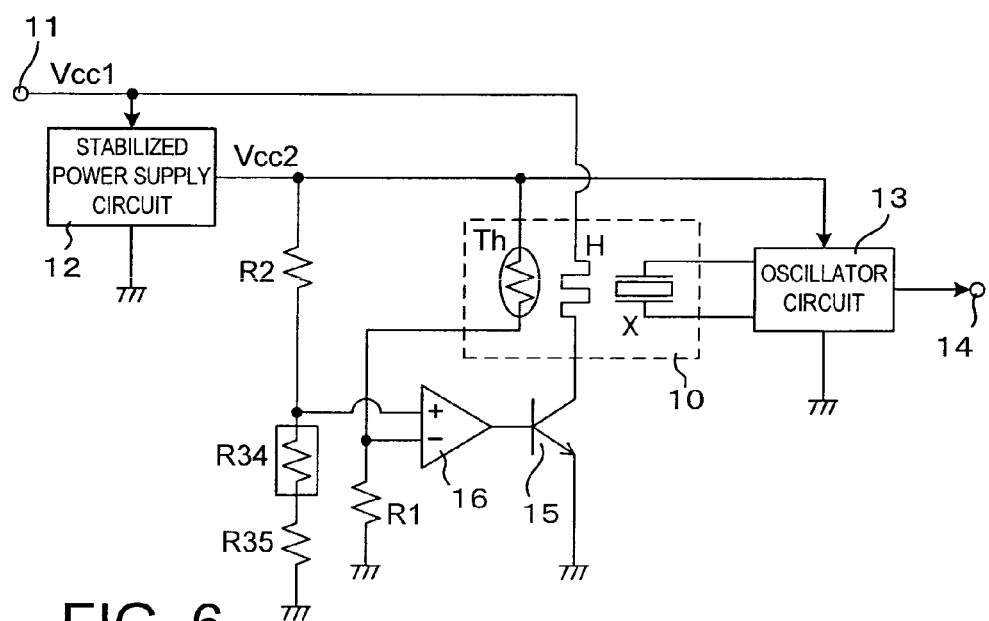
FIG. 6 is a circuit diagram showing a configuration of an oven-controlled crystal oscillator according to yet another embodiment.

An oven-controlled crystal oscillator according to yet another embodiment of the present invention shown in FIG. 6 is similar to the one shown in FIG. 1, but differs from the one shown in FIG. 1 in that resistor R34 and resistor R35 connected in series are installed instead of resistor R3, where resistor R34 has linear positive resistance-temperature characteristics while resistor R35 is a regular resistance element with a low resistance temperature coefficient. Both resistors R1 and R2 are regular resistance elements with low resistance temperature coefficients. The circuit shown in FIG. 6 is also intended to keep temperature in the thermostatic oven constant and equal to the ZTC point of crystal unit X regardless of ambient temperature when there is a relationship such as shown in FIG. 2B between the ambient temperature and the actual temperature in the thermostatic oven. In the circuit of FIG. 6, resistor R1 is used for ZTC adjustment, resistors R2 and R35 are used for sensitivity adjustment, and resistor R34 is used for detection of the ambient temperature. If the two sensitivity adjustment resistors R2 and R35 are set in the same manner as described above, even if the ambient temperature changes, the temperature of crystal unit X can always be set at the ZTC point.

What is claimed is:

1. An oven-controlled crystal oscillator comprising:
a thermostatic oven;
a crystal unit housed in the thermostatic oven;
an oscillator circuit which uses the crystal unit;
a heater that heats the thermostatic oven; and
a temperature control circuit that drives the heater so as to make temperature in the thermostatic oven equal to temperature of a zero temperature coefficient point of the crystal unit,
wherein said temperature control circuit includes:
   a power transistor installed in series with said heater;
   a differential amplifier that drives said power transistor;
   a thermistor that installed in said thermostatic oven, provided with negative resistance-temperature characteristics, and connected between a power supply voltage and an inverting input terminal of said differential amplifier;
   a first resistor installed between the inverting input terminal and a ground point and used to adjust the temperature of the zero temperature coefficient point;
   a second resistor installed between the power supply voltage and a non-inverting input terminal of said differential amplifier; and
   a third resistor installed between the ground point and the non-inverting input terminal, and
wherein one of said second resistor and said third resistor is configured as a resistor assembly provided with a first end and a second end, wherein the resistor assembly comprises:
   a first resistance element;
   a second resistance element; and
   a temperature-detecting resistance element provided with positive resistance-temperature characteristics and adapted to detect ambient temperature
wherein the first resistance element is installed between the first end of the resistor assembly and a connection node while the second resistance element is installed between the connection node and the second end of the resistor assembly, and the temperature-detecting resistance element is installed between the connection node and the second end of the resistor assembly, and
wherein a resistance-temperature coefficient of the temperature-detecting resistance element is larger than each of absolute values of resistance-temperature coefficients of the first resistance elements and the second resistance elements.

2. The crystal oscillator according to claim 1, further comprising:
a power supply terminal supplied with an external power supply voltage; and
a stabilized power supply circuit generating the power supply voltage from the external power supply voltage, the power supply voltage being more stable than the external power supply voltage,
wherein the heater is supplied with the external power supply voltage.

* * * * *